United States Patent [19]

Himi et al.

[11] Patent Number: 5,451,547
[45] Date of Patent: Sep. 19, 1995

[54] METHOD OF MANUFACTURING SEMICONDUCTOR SUBSTRATE

[75] Inventors: Hiroaki Himi; Masaki Matsui, both of Nagoya; Tosiaki Nisizawa, Oobu; Seiji Fujino, Toyota, all of Japan

[73] Assignee: Nippondenso Co., Ltd., Kariya, Japan

[21] Appl. No.: 934,040

[22] Filed: Aug. 25, 1992

[30] Foreign Application Priority Data

Aug. 26, 1991 [JP] Japan ................... 3-213847

[51] Int. Cl.$^6$ ........................................... H01L 21/302
[52] U.S. Cl. ..................... 437/225; 437/62; 437/946; 437/974; 148/DIG. 12
[58] Field of Search ............. 437/946, 225, 62; 148/DIG. 12, DIG. 135

[56] References Cited

U.S. PATENT DOCUMENTS

| | | | |
|---|---|---|---|
| 4,671,846 | 6/1987 | Shimbo et al. | 156/629 |
| 4,700,466 | 10/1987 | Nakagawa et al. | 437/247 |
| 4,956,204 | 9/1990 | Amazawa et al. | 427/252 |
| 4,962,062 | 10/1990 | Uchiyama et al. | 437/225 |

FOREIGN PATENT DOCUMENTS

| | | |
|---|---|---|
| 60-121776 | 6/1985 | Japan . |
| 60-121777 | 6/1985 | Japan . |
| 60-236210 | 11/1985 | Japan . |
| 61-182216 | 8/1986 | Japan . |
| 62-71214 | 4/1987 | Japan . |
| 62-122119 | 6/1987 | Japan . |
| 63-93135 | 4/1988 | Japan . |
| 7471115 | 3/1989 | Japan . |
| 1-137652 | 5/1989 | Japan . |
| 0150328 | 6/1989 | Japan . |
| 1-289109 | 11/1989 | Japan . |
| 2-46722 | 2/1990 | Japan . |
| 2-126525 | 5/1990 | Japan . |

OTHER PUBLICATIONS

Bengtsson et al.; "Interface charge control of directly bonded silicon structures"; J. Appl. Phys. 66(3), Aug. 1989; 1989; pp. 1231-1239.

Haisma et al.; "Silicon-on-Insulator Wafer Bonding-Wafer Thinning Technological Evaluations"; Jap. J. Appl. Phys. 28(8); 1989; pp. 1426-1443.

Brooks et al. "Low-temperature Electrostatic Silicon-to-Silicon Seals using Sputtered Borosilicate Glass"; J. Electrochem. Soc.; vol. 119, No. 4 Apr. 1972; pp. 545-546.

Takayuki Takahagi, Passivation of Si Surface, Applid Physics (Ouyou Butsuri), vol. 59, No. 11, 1990, pp. 1441-1450.

M. Shimbo, et al., "Silicon-to-silicon direct bonding method", J. Appl. Phys. 60(8), 15 Oct. 1986, pp. 2987-2989.

Primary Examiner—Brian E. Hearn
Assistant Examiner—Trung Dang
Attorney, Agent, or Firm—Cushman, Darby & Cushman

[57] ABSTRACT

Disclosed is a method of manufacturing a semiconductor substrate by bonding two silicon crystalline wafers, and particularly, to a method of manufacturing a semiconductor substrate capable of reduced electrical resistance at the bonding interface. In the disclosed method, the silicon wafers to be bonded have at least one surface mirror-polished. Then they are washed, thus forming a natural oxide film on the surface. Then they are soaked in a concentrated HF solution for enough time to remove the oxide film formed on the surface. After that, the silicon wafers are soaked in ultra pure water to replace the fluorine atoms terminated on the surface thereof by OH groups, followed by drying. The silicon wafers thus treated are closely contacted with each other in such a manner that the mirror-polished surfaces are opposed to each other. The silicon wafers are thus bonded to each other by the hydrogen bonding forces due to the OH groups, and then heat treated for reinforcing the bonding.

9 Claims, 6 Drawing Sheets

○ : H
⊙ : F
◐ : OH
● : Si

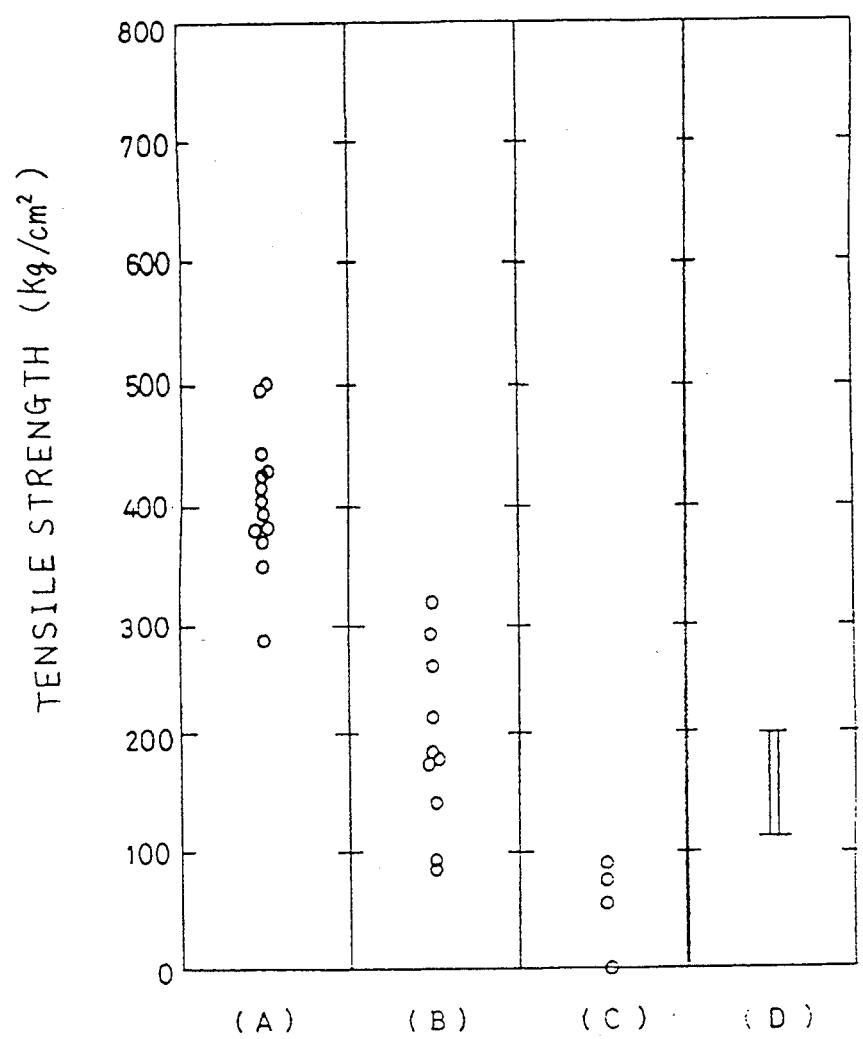

METHOD OF MANUFACTURING SEMICONDUCTOR SUBSTRATE

BACKGROUND OF THE INVENTION

1. Field of the Invention

The present invention relates to a method of manufacturing a semiconductor substrate widely used as the substrate for a power device, a complex device or a VLSI. More particularly, it relates to a method of manufacturing a semiconductor substrate by directly bonding two silicon crystalline wafers to each other.

2. Description of the Related Arts

In a known method of manufacturing a semiconductor substrate by directly bonding two silicon wafers composed of silicon crystalline bodies, together first, each silicon wafer 11 composed of a silicon crystalline body is washed in a washing process shown in FIG. 6A. In this washing process, an oxide film 12 is formed on the surface of the silicon wafer 11.

The silicon wafer 11 thus formed with the oxide film 12 is then soaked in a diluted hydrofluoric acid (1 to 10 wt %) as shown in FIG. 6B for removing the oxide film 12 formed on the surface thereof. After that, it is subjected to oxidation treatment in a $H_2SO_4+H_2O_2$ solution. For example, it is soaked in a solution of $[H_2SO_4 (4):H_2O_2 (1)]$ at 90° C. for 3 to 5 min. Thus a thin oxide film 13 having a thickness of, for example, 50 Å is formed on the surface of the silicon wafer 11 as shown in FIG. 6C. As a result, the surface of the silicon wafer 11 is made hydrophilic.

As shown in FIG. 6D, the silicon wafer 11 is then soaked in ultra pure water for about 30 min. Consequently, the surface of the silicon wafer 11 absorbs water molecules and is thus covered with OH groups. After that, as shown in FIG. 6E, two silicon wafers 111 and 112 thus treated are contacted with each other. Subsequently, as shown in FIG. 6F, they are heat treated to be thus bonded to each other.

In the above conventional method, the surface of the silicon wafer 11 is made hydrophilic and thus covered with OH groups as a result of formation of the thin oxide film 13 thereon by the oxidation treatment in a $H_2SO_4+H_2O_2$ solution. Thus, by contacting the surfaces of two silicon wafers 111 and 112 covered with the OH groups with each other, it is possible to bond them to each other with the aid of hydrogen bonds.

In the above, if the oxidation treatment in a $H_2SO_4+H_2O_2$ solution is not carried out, the surface of the silicon wafer 11 treated with the diluted hydrofluoric acid is not made hydrophilic, which makes it impossible to bond the two silicon wafers 111 and 112 to each other. Accordingly, the oxidation treatment in a $H_2SO_4+H_2O_2$ solution to form a thin oxide film 13 on the surface of silicon wafer 11 is indispensable.

However, the above oxide film 13 formed by the oxidation treatment in a $H_2SO_4+H_2O_2$ solution has the following disadvantages: namely, even if being heat treated thereafter, the oxide film is localized at the bonding interface and the vicinity thereof, thereby increasing the electric resistance in such a direction as passing through the bonding interface; and the localized oxide film brings the occurrence of crystal defects, which causes inconvenience in the characteristics of the device using this semiconductor substrate.

SUMMARY OF THE INVENTION

Taking the above circumstances into consideration, the present invention is an object is to provide a method of manufacturing a semiconductor substrate by bonding two silicon wafers, characterized by omitting the oxidation treatment in a $H_2SO_4+H_2O_2$ solution, and reducing the electric resistance at the bonding interface by eliminating the localization of the oxide film at the bonding interface, thereby forming a device having stable characteristics.

In a preferred mode of the present invention, there is provided a method of manufacturing a semiconductor substrate comprising the steps of: mirror-polishing at least one surface in each of first and second silicon crystalline wafers; washing the surface and then removing an oxide film formed on the surface of the silicon crystalline wafer; directly terminating OH groups to bonds of silicon atoms on the surface; and bonding the first and second silicon crystalline wafers to each other.

In addition, the removal of the oxide film on the surface of the silicon crystalline wafer and the termination of the OH groups are carried out in such a manner that, first, after removal of the oxide film on the surface of the silicon crystalline wafer, the bonds of the silicon atoms on the surface of the silicon crystalline wafer are terminated with atoms having a high degree of electronegativity, and then the above atoms having a high degree of electronegativity are replaced by the OH groups.

It is necessary to terminate the surface of the silicon crystalline wafer as much as possible with the atoms having a high degree of electronegativity. In other words, it is necessary to suppress the ratio of (Si—H) bonds to the total bonds on the surface of the silicon crystalline wafer before bonding to the utmost.

This can be realized by soaking the silicon crystalline wafer in the ultra pure water after soaking it in concentrated HF. This terminates the surface of the silicon crystalline wafer with a lot of fluorine atoms. The fluorine atoms are replaced by the OH groups by soaking the silicon crystalline wafer in the ultra pure water.

Thus, the two silicon crystalline wafers are bonded to each other by the hydrogen bonds from the OH groups, thereby reducing the electrical resistance at the bonding interface by eliminating the localization of the oxygen thereat.

According to the method of the present invention, it is possible to bond two silicon crystalline wafers to each other while eliminating the localization of oxygen at the bonding interface, without an oxidation treatment in a $H_2SO_4+H_2O_2$ solution. Therefore, it is possible to reduce the electrical resistance at the bonding interface and hence to easily form a device having stable characteristics.

BRIEF DESCRIPTION OF THE DRAWINGS

FIG. 5 is a graph showing the bonding strength in the bonded semiconductor substrate according one embodiment of this invention as compared with a bonded substrate of the prior art;

DETAILED DESCRIPTION OF THE EMBODIMENTS

Figure 1A:
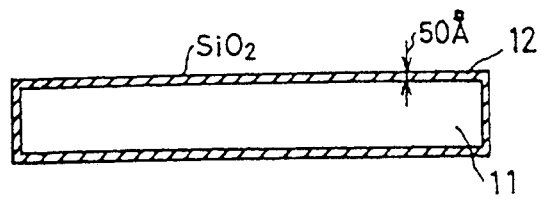
FIGS. 1A to 1E are views showing a method of manufacturing a semiconductor substrate according to one embodidment of the present invention.
Figure 1B:
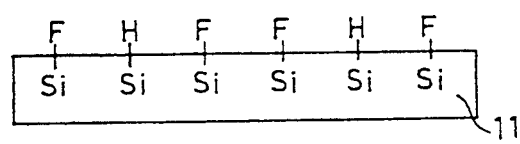
Figure 1C:
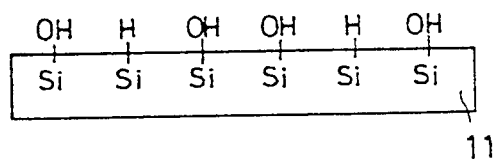
Figure 1D:
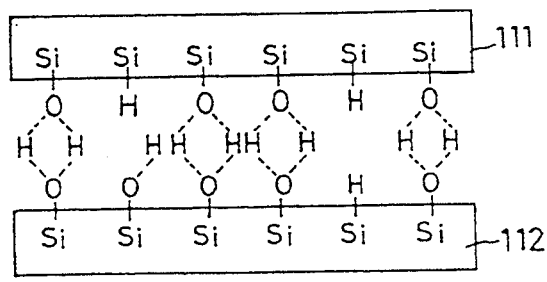
Figure 1E:
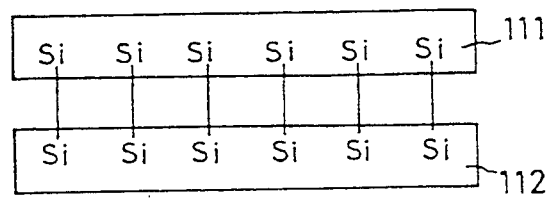

Hereinafter, the present invention will be described by way of a preferred embodiment with reference to the accompanying drawings. FIGS. 1A to 1E show process of bonding silicon wafers 11 composed of silicon crystalline bodies, together wherein at least one surface of each of the the silicon wafers 11 is mirror-polished. In addition, only one silicon wafer 11 is shown in FIGS. 1A to 1C. The manufacturing method according to the present invention will be explained below with reference to FIGS. 1A to 1E. In the drawings: FIG. 1A shows a cleaning process; FIG. 1B shows a soaking process in a concentrated HF; FIG. 1C shows a soaking process in an ultra pure water; FIG. 1D is a process of closely contacting the wafers with the aid of hydrogen bonds due to OH groups; and FIG. 1E is a process of rigidly bonding the wafers by the formation of covalent bonds under heat treatment. The process of soaking the wafer in concentrated HF and ultra pure water as shown in FIGS. 1B and 1C removes the natural oxide film on the surface of the wafer, and the OH groups are directly terminated on the surface of the wafer.

First, as shown in FIG. 1A, the silicon wafer 11 is washed using a standard washing solvent of, for example, SC2 HCl (1):H$_2$O$_2$ (1):H$_2$O (4). In the cleaning process, a natural oxide film 12 composed of a silicon oxide having a thickness of 50 Å is formed on the surface of the silicon wafer 11.

After that, the silicon wafer 11 is soaked in concentrated HF (concentrated hydrofluoric acid: about 50 wt % a. q.) for removing the natural oxide film 12 formed on the surface of the silicon wafer 11. The soaking time is, for example, about 3 min.

Subsequently, as shown in FIG. 1C, the silicon wafer 11 is soaked in ultra pure water. The soaking time is determined to be sufficiently long to react most of fluorine atoms terminated on the surface of the silicon wafer 11 with water molecules for replacing them into OH groups. For example, it may be within the range of about 0.5 to 1 hr.

Then, the excessive water drops adhering on the end portion of the wafer and the wafer carrier are removed by a means such as a spin dryer. After that, as shown in FIG. 1D, the two silicon wafers 111 and 112 thus treated are closely contacted in such a manner that the mirror-polished surfaces thereof are opposed to each other. Thus, the silicon wafers 111 and 112 are bonded to each other with the aid of the hydrogen bonding forces due to the OH groups formed so as to cover most of the surfaces of the silicon wafers 111 and 112. Thereafter, as shown in FIG. 1E, they are heat treated at 600° to 1200° C. thereby forming the covalent bonds, to thus complete the rigid bonding of the silicon wafers.

In addition, this heat treatment is generally carried out in an N$_2$ gas atmosphere; however, it may be carried out in an oxygen, an argon or a hydrogen atmosphere, if the atmosphere thereof is controlled.

In the conventional method as shown in FIGS. 6A to 6F, the washed silicon wafer 11 is soaked in the diluted hydrofluoric acid solution (1 to 10 wt %) for removing the oxide film formed on the surface of the silicon wafer 11, and is then soaked in, for example, the H$_2$SO$_4$+H$_2$O$_2$ solution at 90° C. for 3 to 10 min., to thus form the thin oxide film on the surface of the silicon wafer 11. As a result, the surface of the silicon wafer 11 is made hydrophilic, and is allowed to absorb water molecules by being soaked in the ultra pure water, to be thus covered with the OH groups. In the above, the surface of the silicon wafer 11 after soaking in ultra pure water is made hydrophilic, that is, in such a state as being wettable in water. In other words, the silicon wafer must be made to be hydrophilic prior to the bonding. On the contrary, in the method of this embodiment, the surface of the silicon wafer 11 after being soaked in ultra pure water is made hydrophobic, that is, in the state of repelling water. In other words, it is not particularly required to make the surface of the silicon hydrophilic prior to bonding.

Figure 2A:
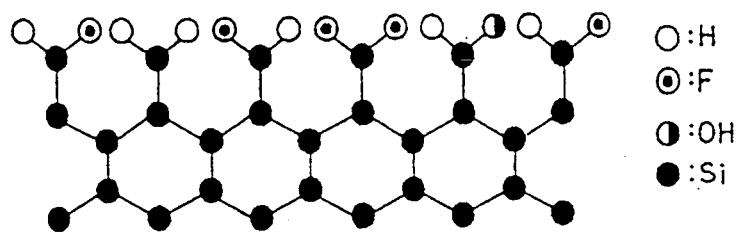
FIGS. 2A and 2B are diagrams showing a typical chemical construction of the surface of a silicon wafer treated with a concentrated HF (about 50 wt %) and a 1 wt % HF, respectively.
Figure 2B:
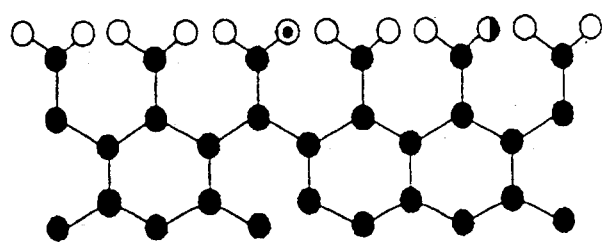

FIG. 2A is a diagram showing a typical chemical construction of the surface of the silicon wafer 11 treated with a concentrated HF (about 50 wt %), and FIG. 2B is a diagram showing a typical chemical construction of the surface of the silicon wafer 11 treated with a diluted HF (1 wt %).

By treatment of the silicon wafer 11 with concentrated HF, fluorine atoms exist in the ratio of 0.38 pieces per one silicon atom. Meanwhile, by treatment with diluted HF, fluorine atoms exist in the ratio of 0.08 pieces per one silicon atom. The residual silicon atoms are terminated to the hydrogen atoms.

Figure 3A:
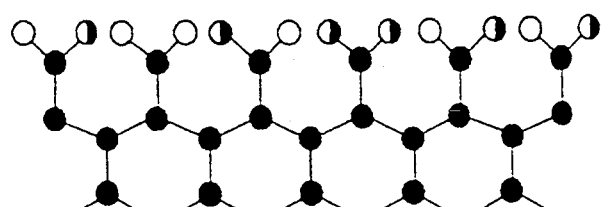
FIGS. 3A and 3B are diagrams showing a typical chemical construction of the surface of a silicon wafer treated with a concentrated HF (about 50 wt %) and a 1 wt % HF respectively, and then soaked in pure water and dried.
Figure 3B:
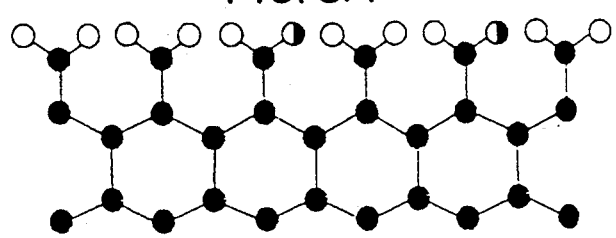

When the silicon wafer 11 is soaked in water, the (Si—F) bonds are converted into (Si—OH) bonds by attack of the water molecules as shown in FIGS. 3A and 3B. However, the (Si—H) bonds remain as they are. As a result, as shown in FIG. 3A, with respect to the surface of the silicon wafer 11 treated with the concentrated HF, about 38% of the surface thereof is covered with OH groups. Meanwhile, as shown in FIG. 3B, with respect to the surface of the silicon wafer 11 treated with diluted HF, about 8% or less of the surface thereof is covered with OH groups. In such a state, the two wafers are closely contacted to each other, the wafers treated with the concentrated HF are bonded to each other by the hydrogen bonds due to the OH groups, whereas the wafers treated with the diluted HF are not bonded to each other. Accordingly, it is thought that the ratio of the (Si—H) bonds prior to the bonding of the wafers must be reduced as much as possible.

Namely, in this embodiment, the fluorine atoms terminated to the bonds of the silicon atoms on the surface of the silicon wafer 11 are reacted with the water molecules to be thus replaced by OH groups, and the presence of the OH groups contributes to the bonding effect. As for the remaining hydrogen atoms when the two silicon wafers are bonded to each other, they are opposed by the hydrogen atoms or the OH groups terminated on the surface of the mating silicon wafer (or by water molecules).

As the bonded silicon wafers in such a state are heat treated, the reaction of the atoms opposed to each other is progressed by the thermal energy. Consequently, the (Si—Si) bonds, (Si—O—Si) bonds and $H_2$ molecules are formed, to thus complete the rigid bonding.

When the silicon wafers are bonded to each other in such a process, the number of oxygen atoms existing at the bonding interface is dependent on only the OH groups, and is made to be one atomic layer or less. These oxygen atoms are easily diffused inside the silicon wafer 11 by heat treatment at 1150° C. for 1 hr, which eliminates an increase in the interface electrical resistance due to the localization of the oxygen atoms.

Meanwhile, in the method with the conventional oxidation treatment in a $H_2SO_4+H_2O_2$ solution as shown in FIGS. 6A to 6F, the oxide film layer having a thickness of at least 100 Å (50 Å per one surface) exists at the bonding interface. This oxide film layer is not easily diffused inside the silicon wafer 11 even by the heat treatment thereafter, thereby increasing the interface resistance.

Figure 4:
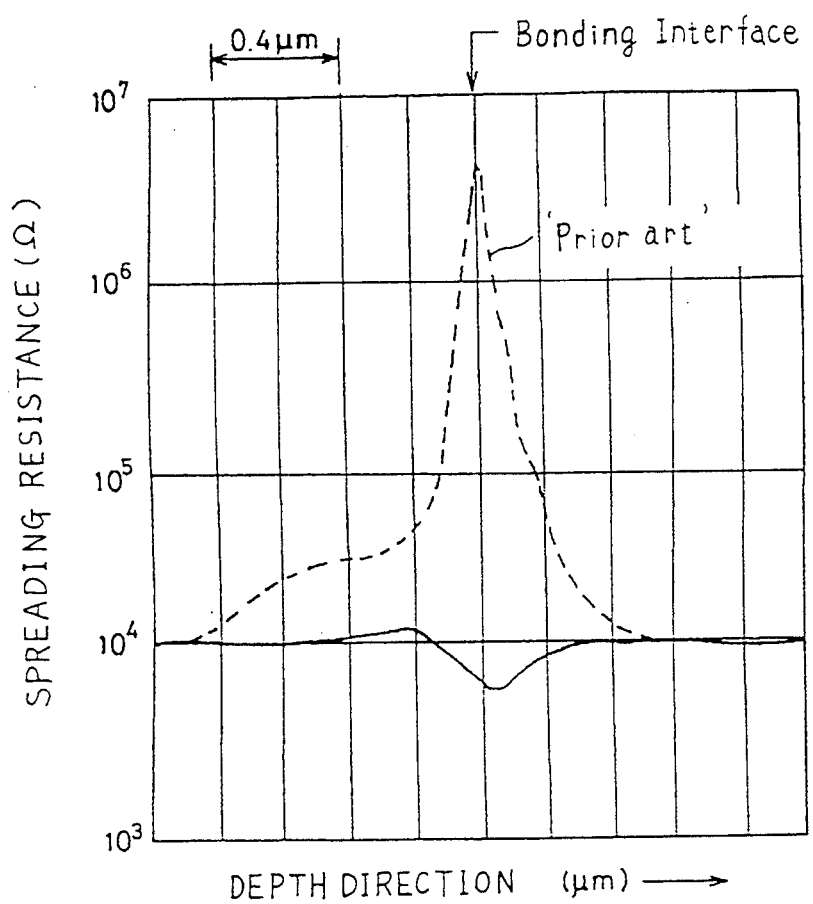
FIG. 4 is a graph showing the electrical resistance at and in the vicinity of the bonding interface in the bonded semiconductor substrate according to one embodiment of this invention as compared with a bonded substrate of the prior art.
Figure 6A:
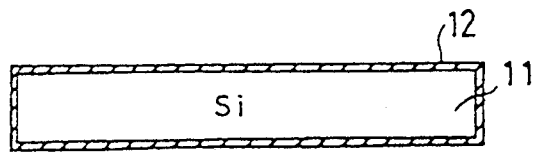
FIGS. 6A to 6F are views explaining a method of manufacturing a semiconductor substrate according to the prior art.
Figure 6B:
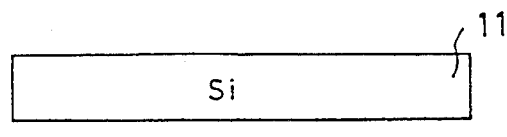
Figure 6C:
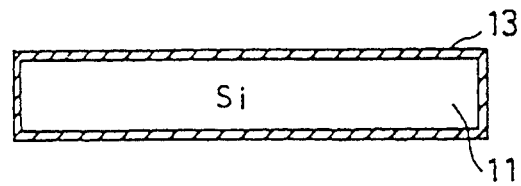
Figure 6D:
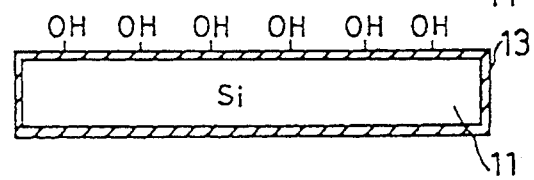
Figure 6E:
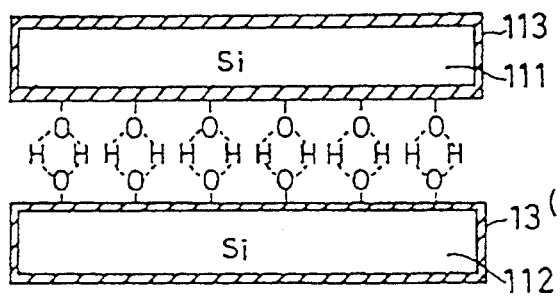
Figure 6F:
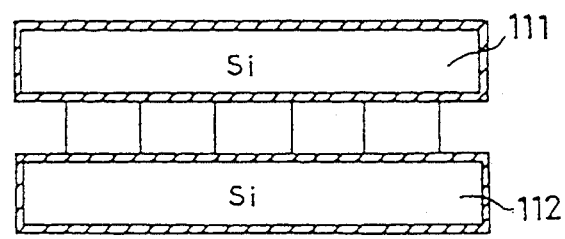

FIG. 4 shows the change of the electrical resistance in the vicinity of the bonding interface of the bonded wafers of the above embodiment in terms of a spreading resistance. In the embodiment which is treated with concentrated HF shown as a solid line in this figure, the spreading resistance in the vicinity of the interface is equal to the value of the bulk silicon. Meanwhile, in the conventional method shown as a broken line (using the oxidation treatment in a $H_2SO_4+H_2O_2$ solution), the spreading resistance value in the vicinity of the bonding interface of the bonded wafers is significantly higher.

In FIG. 5, the bonding strength between the silicon wafers 111 and 112 bonded by the method of this invention are compared with values obtained by the conventional method and values shown in prior art literature. In this figure, (A) shows the bonding strength obtained by the embodiment; (B) shows the bonding strength obtained by the conventional method; and (C) and (D) show the bonding strengths described in prior art literature. As is apparent from FIG. 5, in the silicon wafers bonded by this embodiment, the tensile strength is higher by 2 to 2.5 times over the values in the conventional method or the prior art.

As described above, in the method of manufacturing a semiconductor substrate according to this invention, it is possible to bond two silicon crystalline wafers in such a way as to eliminate the localization of oxygen atoms at the bonding interface, without an oxidation treatment in an $H_2SO_4+H_2O_2$ solution. Therefore, it is possible to reduce the electrical resistance at the bonding interface and to easily form a device having stable characteristics.

A concentrated HF (50 wt %) treatment removes the natural oxide film and adds the fluorine atoms, in the above embodiment; however, a treatment using a hydrofluoric acid with a concentration of 1 wt % or more may also be used.

Also, in place of the concentrated HF treatment as shown in FIG. 1B of this embodiment, a treatment using an ammonium fluoride solution or a hydrofluoric acid-alkali mixed solution may be used for removing the natural oxide film and for adding the fluorine atoms. In this case, after the above treatment, the silicon wafer may be treated in the same manner as shown in FIGS. 1C to 1E. Since the H+ ion concentration in the aqueous solution is reduced by this treatment, the number of hydrogen atoms terminated on the surface of the silicon wafer is reduced according to the chemical equilibrium principle, and the ratio of the surface area terminated by the fluorine atoms or OH groups is increased.

Also, in the embodiment described in FIGS. 1A to 1E, the concentration of the hydrofluoric acid used in the soaking process is specified as a concentrated HF (about 50 wt %); however, the concentration is not particularly limited, and further, after the soaking hydrofluoric acid solution, in the ultraviolet light having a wavelength of 4000 Å or less may be irradiated on the surface of the silicon wafer 11 soaking in the ultra pure water, after which the two silicon wafers 111 and 112 are bonded to each other. By irradiation of the ultraviolet light, the (Si—H) bonds of the hydrogens terminated on the surface of the silicon wafer from the soaking in the hydrofluoric acid solution are cut, to be thus replaced into the OH groups. In addition, since the bonding energy of the (Si—H) bond is 3.05 eV, the wavelength of the ultraviolet light irradiated is preferably specified at the value corresponding to the bonding energy, that is, less than 4073 Å. Further, since the bonding energy of the (Si—O) bond is 3.85 eV and the corresponding wavelength of the ultraviolet light is 3243 Å, the wavelength of the ultraviolet light irradiated is preferably specified at more than 3243 Å.

Figure 7A:
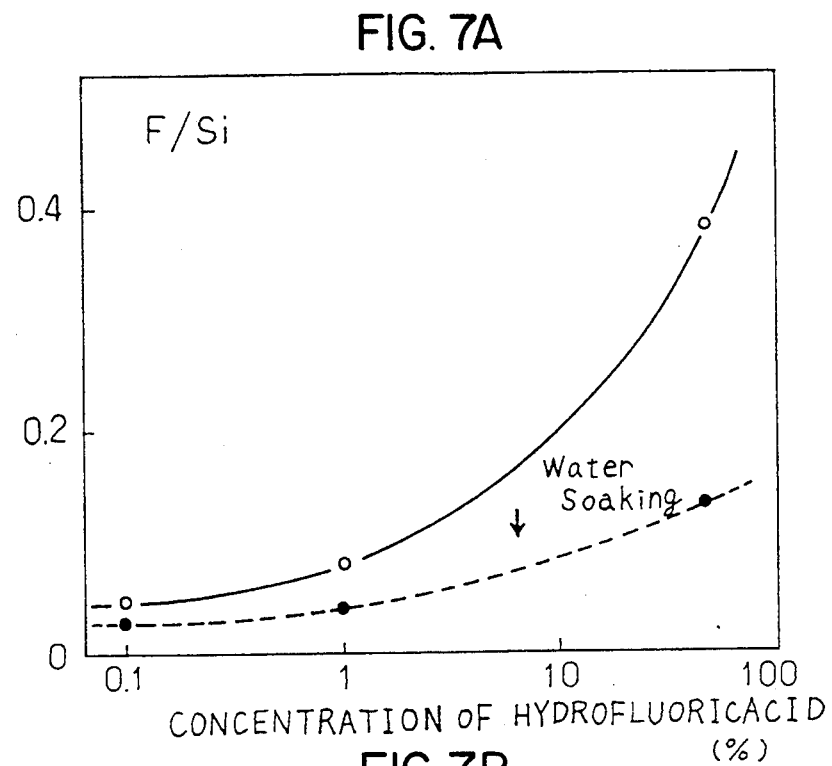
FIGS. 7A and 7B are graphs showing amounts of fluorine and oxygen on the surface of the silicon wafer treated with a hydrofluoric acid depending upon the HF concentration, together with the change depending upon a soaking in pure water.
Figure 7B:
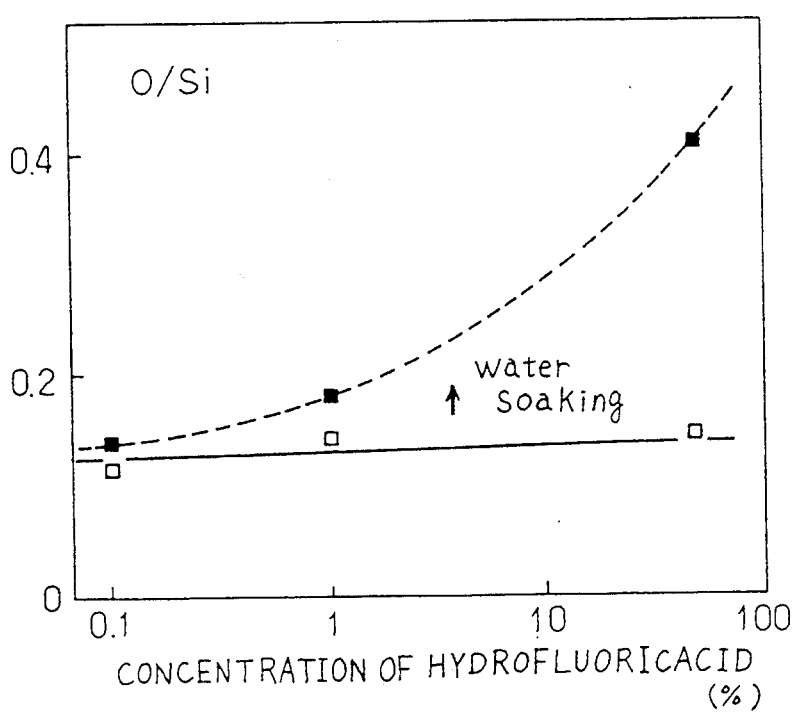

Further, the concentration of the hydrofluoric acid used for the soaking process is specified as concentrated HF (about 50 wt %); however, based on experiments when the silicon wafers are bonded to each other using the hydrofluoric acid of 10 wt % or more, the electrical resistance can be reduced and a bonding strength which is comparable to that of bulk silicon can be obtained. However, when using the hydrofluoric acid of 10 wt % or less it is difficult to bond two silicon wafers to each other at room temperature, and in the case of the concentration of the hydrofluoric acid of 1 wt % or less, two silicon wafers are bonded very little to each other. Therefore, the concentration of hydrofluoric acid is preferably specified at 10 wt % or more. In addition, FIGS. 7A and 7B show the fluorine and oxygen amounts on the surface of the silicon wafer subjected to HF etching depending to the HF concentration, together with the change due to the pure water soaking. The amount of fluorines terminated on the surface is reduced by soaking the silicon wafer in water, and conversely, the oxygen atoms are increased by an amount equal thereto. Thus it can be recognized that the (Si—F) bonds are hydrolyzed and converted into (Si—OH) bonds. The higher the concentration of the hydrofluoric acid, the more the fluorine atoms can be terminated on the surface of the silicon wafer thus enabling the formation of (Si—OH) bonds. Also, since the effects of reducing the interface electrical resistance and obtaining a high bonding strength when the concentration of hydrofluoric acid is 10 wt % or more, it is thought that the fluorine atoms in the ratio of at least 0.2 pieces per one silicon atom are preferably terminated before soaking in the ultra pure water.

Also, in the above embodiment, the surface of the silicon wafer is terminated with the fluorine atoms; however, in place of the above, atoms having degrees of electronegativity like the fluorine atoms, for example, the other halogen elements such as chlorine, may be used to terminate. For example, if chlorine atoms are used to terminate, the silicon wafer is heated with 1000° C. or more at an atmosphere of hydrogen added with the chlorine using an HCl gas or the like, to thus remove the natural oxide film on the surface. After the removal of the natural oxide film, the silicon wafer is cooled to about 200° C. while keeping the chlorine atmosphere, and is then taken-off while changing the chlorine atmosphere into an inert gas atmosphere. Thus the surface of the silicon wafer is terminated with chlorine atoms and hydrogen atoms. Thereafter, in the same manner as shown in FIG. 1C, the silicon wafer is soaked in the ultra pure water, so that the terminated chlorine atoms are replaced into OH groups, followed by the treatments as shown in FIGS. 1D and 1E. Also, in the ultra pure water soaking process, the ultraviolet light may be irradiated in the manner as described above.

Further, in the above embodiment, by soaking the silicon wafer in the hydrofluoric acid solution, the natural oxide film formed on the surface is removed and simultaneously the surface is terminated with many fluorine atoms; however, this process may be divided into a process of removing the oxide film on the surface and a process of terminating the surface with many fluorine atoms; and further, the kind of atoms terminating the surface may include atoms which are high in electronegativity, other than the fluorine, such as chlorine or bromine. In this case, for removing the oxide film on the surface, the silicon wafer may be heated in a vacuum, preferably, in a ultra high vacuum, or may be subjected to sputtering in a vacuum. Further, for terminating the surface with atoms having a high degree of electronegativity, in the same vacuum as the process of removing the above oxide film, the silicon wafers may be exposed in a chlorine gas atmosphere such as HCl or $Cl_2$ or the plasma atmosphere thereof; in a fluorine atmosphere such as HF or $SF_6$ or the plasma atmosphere thereof; or in a bromine atmosphere such as HBr or the plasma atmosphere thereof. Thereafter, the silicon wafer may be soaked in ultra pure water in the same manner as shown in FIG. 1C, so that the terminated chlorine, fluorine or bromine atoms are replaced by the OH groups. The silicon wafer is then treated in the same manner as shown in FIGS. 1D and 1E. Also, as described above, the ultraviolet light may be irradiated on the silicon wafer soaked in the ultra pure water.

What is claimed is:

1. A method of manufacturing a semiconductor substrate comprising the steps of:
    washing the surfaces of a first and a second silicon crystalline wafer, each having at least one surface which is mirror-polished;
    removing an oxide film formed on said mirror-polished surface of said first and second silicon crystalline wafers by soaking said first and second wafers in a hydrofluoric acid solution of 10 wt % or more, said hydrofluoric acid solution terminating the bonds of silicon atoms on said mirror-polished surfaces with terminating fluorine atoms;
    replacing said terminating fluorine atoms with terminating OH groups, including a step of soaking said first and second silicon crystalline wafers in pure water to react most of said terminated fluorine atoms with water molecules; and
    contacting said mirror-polished surface of said first and second silicon crystalline wafers with each other by hydrogen bonds of the OH groups, to produce contacted mirror-polished surfaces which are substantially oxide-free.

2. A method of manufacturing a semiconductor substrate according to claim 1, comprising the further step of:
    heat treating said contacted first and second silicon crystalline wafers reinforcing the bonding between said first and second silicon crystalline wafers.

3. A method of manufacturing a semiconductor substrate according to claim 2, wherein said hydrofluoric acid comprises a concentrated HF.

4. A method of manufacturing a semiconductor substrate comprising the steps of:
    washing a first and a second silicon crystalline wafer, said first and second wafers having at least one mirror-polished surface;
    removing an oxide film formed on said mirror-polished surface of said first and second silicon crystal wafers by terminating silicon atom bonds on said mirror-polished surface with atoms having a high degree of electronegativity;
    replacing said terminating high electronegativity atoms with OH groups by soaking said first and second silicon crystalline wafers in pure water, said replacing said terminating high electronegativity atoms step being carried out while said first and second silicon crystalline wafers are being irradiated with an ultraviolet light; and
    mating said mirror-polished surface of said first and second silicon crystalline wafers to each other, said first and second silicon crystalline wafers being contacted by hydrogen bonds of said OH groups, said mirror-polished surface being substantially oxide-free.

5. A method of manufacturing a semiconductor substrate according to claim 4, wherein:
    said atoms having a high degree of electronegativity comprise fluorine atoms; and
    said ultraviolet light has a wavelength of 400 nm or less.

6. A method of manufacturing a semiconductor substrate comprising the steps of:
    washing a first and a second silicon crystalline wafer, said first and second wafers having at least one mirror-polished surface;
    removing an oxide film formed on said mirror-polished surface of said first and second silicon crystal wafers by terminating silicon atom bonds on said mirror-polished surface with fluorine atoms, said removing oxide film step including soaking said first and second silicon crystalline wafers in a hydrofluoric acid-alkali mixed solution;
    replacing said terminating fluorine atoms with OH groups by soaking said first and second silicon crystalline wafers in pure water; and
    mating said mirror-polished surface of said first and second silicon crystalline wafers to each other, said first and second silicon crystalline wafers being contacted by hydrogen bonds of said OH groups, said mirror-polished surface being substantially oxide-free.

7. A method of manufacturing a semiconductor substrate comprising the steps of:
    washing a first and a second silicon crystalline wafer, said first and second wafers having at least one mirror-polished surface;
    removing an oxide film formed on said mirror-polished surface of said first and second silicon crystal wafers by terminating silicon atom bonds on said mirror-polished surface with chlorine atoms, said removing oxide film step including a step of heating said first and second silicon crystalline wafers in an atmosphere of hydrogen added with chlorine;

replacing said terminating chlorine atoms with OH groups by soaking said first and second silicon crystalline wafers in pure water; and mating said mirror-polished surface of said first and second silicon crystalline wafers to each other, said first and second silicon crystalline wafers being contacted by hydrogen bonds of said OH groups, said mirror-polished surface being substantially oxide-free.

8. A method of manufacturing a semiconductor substrate comprising:

washing a first and a second silicon crystalline wafer, said first and second wafers having at least one mirror-polished surface;

removing an oxide film formed on said mirror-polished surface of said first and second silicon crystal wafers by heating said first and second wafers in a vacuum;

terminating silicon atom bonds on said mirror-polished surface of said first and second silicon crystalline wafers with terminating halogen atoms by exposing said first and second wafers to a halide gas;

replacing said terminating halogen atoms with OH groups; and mating said mirror-polished surface of said first and second silicon crystalline wafers to each other, said first and second silicon crystalline wafers being closely contacted by hydrogen bonds of said OH groups, said mirror-polished surfaces being substantially oxide-free.

9. A method of manufacturing a semiconductor substrate comprising:

washing a first and a second silicon crystalline wafer, said first and second wafers having at least one mirror-polished surface;

removing an oxide film formed on said mirror-polished surface of said first and second silicon crystal wafers by subjecting said first and second wafers to sputtering in a vacuum;

terminating silicon atom bonds on said mirror-polished surface of said first and second silicon crystalline wafers with halogen atoms by exposing said first and second wafers to a halide gas in said vacuum;

replacing said terminating halogen atoms with OH groups; and mating said mirror-polished surface of said first and second silicon crystalline wafers to each other, said first and second silicon crystalline wafers being contacted by hydrogen bonds of said OH groups, said mirror-polished surfaces being substantially oxide-free.

* * * * *